United States Patent [19]
Jones

[11] Patent Number: 5,863,836
[45] Date of Patent: Jan. 26, 1999

[54] METHOD OF DEPOSITING THIN METAL FILMS

[75] Inventor: Anthony Copland Jones, Prescot, United Kingdom

[73] Assignee: Defense Evaluation and Research Agency, Farnborough, United Kingdom

[21] Appl. No.: 586,735

[22] PCT Filed: Jul. 29, 1994

[86] PCT No.: PCT/GB94/01654

§ 371 Date: Aug. 22, 1996

§ 102(e) Date: Aug. 22, 1996

[87] PCT Pub. No.: WO95/04168

PCT Pub. Date: Feb. 9, 1995

[30] Foreign Application Priority Data

Jul. 30, 1993 [GB] United Kingdom ............... 9315771

[51] Int. Cl.⁶ .................................................. H01L 21/44
[52] U.S. Cl. ........................................... 438/681; 438/688
[58] Field of Search ............................ 427/252; 438/679, 438/681, 688

[56] References Cited

U.S. PATENT DOCUMENTS

| | | | |
|---|---|---|---|
| 4,328,261 | 5/1982 | Heinecke et al. | |
| 4,923,717 | 5/1990 | Gladfelter et al. | 427/252 |
| 5,151,305 | 9/1992 | Matsumoto et al. | 427/252 |
| 5,376,409 | 12/1994 | Kaloyeros et al. | 427/248.1 |

FOREIGN PATENT DOCUMENTS 1320098  4/1971  United Kingdom .

OTHER PUBLICATIONS

FitzGerald et al., Comparative Studies of the Thermal Decomposition of Tritertiarybutylgallium and Tri–isobutylgallium on GaAs (100) *Surface Science*, 278 (1992), 111–120.

Jones, et al., New Metalorganic Gallium Precursors For The Growth of GaAs and ALGaAs by CBE, *J. of Crystal Growth*, 124 (1992) 81–87.

Foord et al., Applications of MBMS and Surface Spectroscopic Techniques in the Study of Reaction Mechanisms in CBE; Investigations of the Reactivity of Tritertiarybutylgallium and Triisobutylgallium as Alternative Precursors for Epilayer Growth, *J. of Crystal Growth*, 120 (1992) 103–113.

Jones, Growth of aluminum films by low pressure chemical vapor deposition using tritertiarybutylaluminum, *Journal of Crystal Growth*, 285–289, Jul. 31, 1993.

*Primary Examiner*—Charles L. Bowers, Jr.
*Assistant Examiner*—Renee R. Berry
*Attorney, Agent, or Firm*—Woodard, Emhardt, Naughton Moriarty & McNett

[57] ABSTRACT

A method of depositing a Group IIIA metal layer of high purity on a substrate comprises pyrolyzing contacting the substrate with a tritertiary butyl compound of the Group IIIA metal and pyrolyzing the compound to leave the Group IIIA metal deposited on the substrate. The method of the invention may be used on any suitable substrate, such as silicon or polyimide. The method of the invention may be used for the growth of Group IIIA/silicon alloys as well as for depositing semi-conducting III–V alloys such as, for example, AlGaAs, AlInAs and AlSb.

11 Claims, No Drawings

METHOD OF DEPOSITING THIN METAL FILMS

This invention concerns a method of depositing thin metal films, particularly of aluminium.

The deposition of thin films of aluminium is important for a variety of applications, such as the metallisation of silicon devices in VLSI technology, the growth of semi-conducting III–V alloys eg. AlGaAs, AlInAs and AlSb and the growth of dielectrics, such as AlN. In addition, hybrid sensors based on digital recording media are currently under development which require the deposition of aluminium on micron-size steps or holes etched on silicon.

Metalorganic chemical vapour deposition (MOCVD) is an attractive thin film growth technique possessing the advantages of large area growth capability, accurate control of layer thickness and good conformal step coverage. Much effort has, therefore, been directed at developing suitable aluminium CVD precursors.

The use of metalorganic compounds of gallium as CBE precursors has been investigated (see Journal of Crystal Growth 120 (1992) 103–113 and 124 (1992) 81–87; Surface Science 278 (1992) 111–120) including the use of tritertiarybutylgallium, tri-isobutylgallium and tri-isopropylgallium. Whilst all the compounds gave rise to reduced carbon contamination of the metal film, tritertiary-butylgallium had unacceptably low growth rates.

Volatile metalorganic compounds of aluminium have been widely investigated as CVD precursors including trimethylaluminium, dimethylaluminium hydride and higher aluminium alkyls of the formula $AlR_3$ where R is n-propyl, n-butyl and i-butyl. However, aluminium films grown using these precursors have frequently demonstrated poor morphology and low purity. In particular, carbon contamination has resulted from the decomposition of the organic radical during metalorganic pyrolysis. That has stimulated research into the aluminium hydride based adducts bis-trimethylamine alane and dimethylethylamine alane from which carbon free aluminium and low carbon content AlGaAs have been grown. However, doubts remain about the large scale application of these alane adducts due to an unpredictable gas phase chemistry which can lead to premature decomposition and also their tendency to liberate hydrogen during storage at room temperatures.

The most successful and widely investigated CVD precursor to date has been triisobutylaluminium (TIBA). Detailed surface science studies have shown that at temperatures less than 327° C. the facile β-hydride elimination of iso-butylene leads to carbon free aluminium films. However, at higher temperatures the iso butyl radical can eliminate a β-methyl group which leads to surface methyl radicals and to a significant increase in carbon content of the deposited aluminium film. That limits the temperature range for aluminium deposition from TIBA and precludes its use in the growth of technologically important Al/Si alloys, which require high substrate temperatures, typically above 400° C., to pyrolyze the silicon precursor, typically $SiH_4$.

Therefore, a need exists for an aluminium precursor which combines the advantages of stability associated with trialkylaluminium compounds with the potential to deposit high purity aluminium films. Analogous indium compounds may also be useful for their deposition.

It has now been surprisingly found that tritertiarybutyl aluminium may be used as a precursor for aluminium deposition.

Accordingly the present invention provides a method of depositing an aluminum or indium film on a substrate comprising the steps of contacting the substrate with an aluminum or indium precursor and treating the precursor to decompose leaving the aluminium or indium deposited on the substrate, wherein the precursor is the tritertiarybutyl compound of aluminium or indium.

The present invention further provides a substrate having an aluminum or indium layer deposited thereon from a precursory decomposing same on the substrate, wherein the precursor is a tritertiary butyl compound of the aluminum or indium.

Aluminium is the metal of most importance for the method of the invention.

In a preferred method of the invention the precursor is delivered to a substrate as a vapour phase and is pyrolyzed on the substrate to leave a film of metal on the substrate. The method of the invention may also be carried out in the liquid phase, such as, for example, by coating the substrate with the precursor or by dipping the substrate into the precursor, before heating to pyrolyze the precursor to leave the metal on the substrate.

In a preferred method of the invention the substrate is heated to a suitable temperature to pyrolyze the precursor. Temperatures in the range of 150° C. to 400° C. may be suitable, although temperatures above and below this range may also be used.

The method of the invention may be used on any suitable substrate, such as silicon or polyimide. The method of the invention may be used for the growth of aluminium/silicon or indium/silicon alloys, which require very high temperatures to pyrolyze the silicon precursor, typically $SiH_4$.

The method of the invention may be used for depositing semi-conducting III–V alloys such as, for example, AlGaAs, AlInAs and AlSb and for the growth of dielectrics, such as AlN.

Tritertiarybutyl aluminium (TTBA) may also be a suitable precursor for growth of low carbon AlGaAs by reduced pressure MOVPE or by chemical beam epitaxy (CBE), in which methyl-free metalorganic precursors have been shown to be essential.

Tritertiarybutyl aluminium may extend the temperature range from which high purity aluminium can be deposited. TTBA may be used in a range of applications in the growth of conductive thin films of aluminium using LPCVD.

This invention will now be further described by means of the following Example.

EXAMPLE

Tritertiarybutyl aluminium was synthesised using the method described in Ann. Chem. 719 (1968)40 and the resultant colourless liquid was characterised using proton nuclear magnetic resonance ($^1$HNMR) and inductively coupled plasma emission spectroscopy (ICP-ES)

$^1$HNMR ($C_6D_6$) ppm: 1.3 (s, Al—$C(CH_3)_3$)

ICP-ES: Al content (%) found 13.1, calculated 13.6.

Aluminium films were deposited in a simple cold wall horizontal quartz reactor (Electrogas Ltd) using radiant substrate heating. The substrates used were Si (111) single crystal slices which were degreased using acetone, washed in 20% HNO$_3$/Dl water and dried before use. No further pre-treatment was used. The TTBA source was held at 30° C. at which temperature it has a suitable vapour pressure (>1 Torr) for LPCVD. This produced growth rates upto 1.2 mh$^{-1}$ at a substrate temperature of 400° C. Layer thickness was obtained using tallystep methods. A full summary of growth conditions is given in Table 1 below.

TABLE 1

Growth conditions used to deposit aluminium from TTBA

| | |
|---|---|
| Cell pressure | 4.56 Torr |
| Substrates | Single crystai Si(111) |
| TTBA source temperature | 30° C. |
| N$_2$ carrier gas flow | 1.0S–3.0 SCCM |
| Growth Temperature | 300–400° C. |
| Maximum growth rates | 1.5 mh$^{-}$1 at 400° C. |

The aluminium films were characterised initially by dissolution in hydrochloric acid and metals analysis for by inductively coupled mass spectrometry (ICP-MS) which showed them to be aluminium >99% purity on a metals basis.

Aluminium films were deposited from TTBA in the temperature range of from 300° 400° C. and were matt grey with only a low reflectivity (typically 30% at 633 nm). This may be attributed to rough surface morphology which has frequently been observed in films deposited using TIBA unless pre-treatment with TiCl$_4$ is employed.

The aluminium films produced from TTBA were found to be conducting.

The adhesive properties of films grown on Si(111) at 400° C. was also excellent and in the "Scotch tape" test the films remained intact as the tape was peeled away from the aluminium film.

The use of trialkylaluminium precursors for deposition of aluminium raises concern about incorporation of carbon in the deposited film especially at the relatively high substrate temperatures used in this Example. However, the results of Auger electron analysis, as shown in Table 2 below indicate that only trace carbon and oxygen are present in aluminium films grown at 400° C. using TTBA.

For comparison the conventional precursor TIBA was used to deposit an aluminium film under identical conditions to those shown in Table 1 above. Auger analysis of this layer is given in Table 2 below and shows it to be of lower purity than the layer from TTBA, containing higher levels of carbon and of oxygen. Further analysis of separate aluminium films by secondary ion mass spectroscopy confirmed that carbon levels were at least a factor of three lower in aluminium films grown using TTBA compared with those grown using TIBA.

TABLE 2

Auger electron spectral analysis of aluminium films grown at 400° C. on Si(111) using TTBA and TIBA.
Atomic Composition %

| Film Precursor | Al | C | O |
|---|---|---|---|
| TTBA | 98.2 | 0.7 | 1.1 |
| TIBA | 84.5 | 3.1 | 12.4 |

* Sub-surface information (2000 A or below) obtained by combining AES with sequential ion bombardment.

Levels of oxygen in aluminium films grown using TTBA were found to be lower than those grown using TIBA. This may reflect a reduced tendency for oxygen to be entrained in the sterically bulky and rigid TTBA molecule. The presence of oxygen at all in the TTBA-grown film may be attributed to the use of a simple CVD reactor from which rigorous exclusion of trace oxygen was not possible.

I claim:

1. A method of depositing an aluminum or indium film on a substrate comprising the steps of contacting the substrate with an aluminum or indium precursor and treating the precursor to decompose leaving the aluminum or indium deposited in the substrate, wherein the precursor is the tritertiarybutyl compound of aluminum or indium.

2. A method as claimed in claim 1, wherein the precursor is delivered to the substrate as a vapour phase and is pyrolyzed on the substrate.

3. A method as claimed in claim 1, wherein the precursor is in liquid form and the substrate is coated therewith before heating to pyrolyze the precursor.

4. A method as claimed in claim 1, wherein said contacting step comprises coating the substrate with the precursor, and wherein said treating step comprises heating the coated substrate to pyrolyze the coating onto the substrate.

5. A method as claimed in claim 4, wherein said heating step is effective to heat the substrate to a temperature of between about 150° C. and about 300° C.

6. A method as claimed in claim 1, wherein the substrate is silicon or polyamide.

7. A method as claimed in claim 1, wherein an aluminium/silicon or indium/silicon alloy is formed by treatment of the precursor with a silicon precursor also deposited on the substrate.

8. A method as claimed in claim 7, wherein the silicon precursor is SiH$_4$.

9. A method as claimed in claim 1, wherein said treating step produces a Group III/V alloy by treatment of the aluminium or indium precursor with a Group V precursor also deposited on the substrate.

10. A method as claimed in claim 9, wherein the alloy produced is selected from AlGaAs, AlInAs and Alsb.

11. A composition of matter comprising a substrate having an aluminium or indium layer deposited thereon by contacting the substrate with an aluminium or indium precursor and treating the precursor to decompose leaving the aluminium or indium deposited on the substrate, wherein the precursor is the tritertiarybutyl compound of aluminium or indium.

* * * * *